United States Patent [19]
Notani et al.

[11] Patent Number: 5,349,317
[45] Date of Patent: Sep. 20, 1994

[54] HIGH FREQUENCY SIGNAL TRANSMISSION TAPE

[75] Inventors: Yoshihiro Notani; Takayuki Katoh, both of Itami, Japan

[73] Assignee: Mitsubishi Denki Kabushiki Kaisha, Tokyo, Japan

[21] Appl. No.: 40,599

[22] Filed: Mar. 31, 1993

[30] Foreign Application Priority Data

Apr. 3, 1992 [JP] Japan .................................. 4-112234

[51] Int. Cl.$^5$ ........................... H01P 3/00; H01P 3/08
[52] U.S. Cl. ................... 333/236; 333/238; 333/260
[58] Field of Search ............... 333/33, 238, 246, 247, 333/260, 236, 243; 29/828, 829; 257/664, 728; 174/117 F, 117 FF

[56] References Cited

U.S. PATENT DOCUMENTS

| | | | |
|---|---|---|---|
| 2,812,501 | 11/1957 | Sommers | 333/238 |
| 3,458,650 | 7/1969 | Migawaki et al. | 174/117 F |
| 3,560,893 | 2/1971 | Wen | 333/238 X |
| 3,763,306 | 10/1973 | Marshall | 333/243 X |
| 4,600,907 | 7/1986 | Grellman et al. | 333/246 |
| 4,806,892 | 2/1989 | Thorpe et al. | 333/246 |
| 4,816,789 | 3/1989 | Mars | 333/246 |
| 5,068,632 | 11/1991 | Champeau | 333/246 X |

FOREIGN PATENT DOCUMENTS

| | | |
|---|---|---|
| 0337485 | 4/1989 | European Pat. Off. . |
| 2139064 | 2/1972 | Fed. Rep. of Germany ...... 333/238 |
| 61-245544 | 10/1986 | Japan . |
| 64-5102 | 1/1989 | Japan . |
| 276302 | 3/1990 | Japan . |
| 3120736 | 5/1991 | Japan . |
| 438855 | 2/1992 | Japan . |

OTHER PUBLICATIONS

Cheng P. Wen, "Coplanar Waveguide: A Surface Strip Tranamission Line Suitable for Nonreciprocal Gyromagnetic Device Applications", IEEE Transactions on Microwave Theory and Techniques, vol. MTT-17, No. 12, Dec. 1969, pp. 1087-1090.

"20 GHz Band MMIC Modules Assembled By Impedance-Matched Film Carrier", Autumn National Convention Record, The Institute of Electronics, Information and Communication Engineers, 1989.

*Primary Examiner*—Paul Gensler
*Attorney, Agent, or Firm*—Leydig, Voit & Mayer

[57] ABSTRACT

A high frequency signal transmission tape for connecting a plurality of high frequency IC chips to each other or connecting a high frequency IC chip to a signal transmission line disposed on a package includes an insulating thin film having a surface; a conductive signal line disposed on the surface; and two conductive grounding lines disposed on the surface on opposite sides of, parallel to, and spaced from the signal line. The signal transmission tape produces small reflection and attenuation of signals in an extremely high frequency band, i.e., a millimeter-wave frequency band over 30 GHz. Therefore, high frequency IC chips arbitrarily arranged on a package are easily connected using the high frequency signal transmission tape.

6 Claims, 16 Drawing Sheets

HIGH FREQUENCY SIGNAL TRANSMISSION TAPE

FIELD OF THE INVENTION

The present invention relates to a high frequency signal transmission tape for connecting semiconductor devices operating at frequencies higher than several tens of MHz to each other or connecting the semiconductor device to an external circuit element, such as a package. The invention also relates to an apparatus for bonding the high frequency signal transmission tape.

BACKGROUND OF THE INVENTION

FIG. 11 is a perspective view illustrating a conventional high frequency IC package. In the figure, a package body 1 comprises a dielectric part 1a comprising ceramic or the like and a chip bonding part 1b comprising metal or the like. A signal transmission line 6 is disposed on the dielectric part 1a. The chip bonding part 1b is grounded. High frequency IC chips 2a and 2b are disposed on the chip bonding part 1b. Each of the IC chips includes input-output pads 3 through which the IC chip is connected to the adjacent IC chip or to the signal transmission line 6 of the package 1.

The IC chips 2a and 2b are fixed on the chip bonding part 1b using solder, conductive resin, or the like. Thereafter, as shown in FIG. 12, a metal wire 4 comprising Au, Al, or the like is pressed on the pad 3 of the IC chip 2 using a wedge type blade 5 of a bonding apparatus (not shown) and adhered to the pad 3 by thermocompression bonding or ultrasonic bonding.

FIG. 13 is a perspective view illustrating the package 1 after the wire-bonding process. In FIG. 13, a metal wire 4b connects the pads 3 of the adjacent IC chips 2a and 2b to each other and a metal wire 4a connects the pad 3 of the IC chip 2a to the signal transmission line 6 of the package 1. The length of each metal wire is about 300 microns. In this structure, high frequency signals are transferred through the IC chips and the signal transmission line via the metal wires.

The metal wire for connecting the high frequency IC chips has the following drawbacks. Since the characteristic impedance of the metal wire significantly varies according to its length and shape, a large signal reflection occurs at the boundary between the metal wire and the bonding pad of the IC chip. In addition, the large inductance of the metal wire increases the signal attenuation. For example, when an Au wire having a length of 1 mm and a diameter of 25 microns is employed, the attenuation increases with the increase in the frequency as shown in FIG. 14, adversely affecting the device characteristics. When the frequency exceeds 26 GHz, the attenuation exceeds 10 dB (power ratio of 1/10 or below), which makes the practical use of the device difficult.

Meanwhile, Japanese Published Patent Application No. 3-120736 discloses a semiconductor device in which a high frequency IC chip is connected to a coplanar transmission line on a package via bump electrodes. This structure is illustrated in FIGS. 15(a) and 15(c). In these figures, the coplanar transmission line comprising a signal conductor 31 and grounding conductors 32 is disposed on a ceramic substrate 33. The ceramic substrate 33 is disposed on a metal module frame 30. Bump electrodes 34 are disposed on the conductors 31 and 32. When mounting the high frequency IC chip 2 on the substrate, the input-output pads 3 of the IC chip 2 are pressed onto the bump electrodes 34 while applying heat, whereby the pads 3 are electrically and physically connected to the bump electrodes 34.

FIG. 16 is a perspective view, partly broken away, illustrating an impedance-matched film carrier described in "20 GHz Band MMIC Modules Assembled by Impedance-Matched Film Carrier" at page 29 of 1989 Autumn National Convention Record, The Institute of Electronics, Information and Communication Engineers. In FIG. 16, grounding conductors 41 are disposed on the rear surface of a polyimide film 40, and a signal conductor 42 is disposed between the grounding conductors 41, providing a coplanar transmission line. Portions of the polyimide film 40 are opened to expose the coplanar transmission line. When mounting a high frequency IC chip on the film carrier, input-output pads of the IC chip (not shown) are connected to the coplanar transmission line via the openings 43.

In the above-described prior arts, however, it is necessary to form the coplanar transmission line on the package or the film carrier in advance and in accordance with the shape or the arrangement pattern of the high frequency IC chip to be connected thereto, resulting in an increased production cost and a restricted pattern layout of the IC chip.

SUMMARY OF THE INVENTION

It is an object of the present invention to provide a high frequency signal transmission tape that reduces reflection and attenuation of signals in the extremely high frequency band, i.e., the millimeter-wave frequency band over 30 GHz, and that connects high frequency IC chips arbitrarily disposed on a package to each other with no increase in the production cost and no restriction of the pattern layout.

It is another object of the present invention to provide an apparatus for bonding the high frequency signal transmission tape.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a high frequency signal transmission tape for connecting a plurality of high frequency IC chips to each other or connecting the high frequency IC chip to a signal transmission line on a package comprises an insulating thin film having a surface, a conductive signal line disposed on the surface of the insulating thin film, and conductive grounding lines disposed on opposite sides of and parallel to the signal line at a prescribed spacing from the signal line. Therefore, high frequency IC chips which are arbitrarily arranged on the package are easily connected to each other using the high frequency signal transmission tape.

According to a second aspect of the present invention, an apparatus for bonding the high frequency signal transmission tape onto an input-output pad of an IC chip or onto a signal transmission line of a package includes a bonding blade having three convex portions respectively corresponding to the signal line and the grounding lines of the signal transmission tape, and means for applying ultrasonic waves or heat to the signal line and the grounding lines via the three convex portions of the blade to adhere the signal transmission tape to the input-output pad or the signal transmission line.

According to a third aspect of the present invention, the high frequency signal transmission tape includes slits formed in the width direction of the insulating thin film so that the signal line and the grounding lines lying under the thin film are exposed. Therefore, during bonding, ultrasonic waves or heat is directly applied to the signal line and the grounding lines with high efficiency.

According to a fourth aspect of the present invention, the high frequency signal transmission tape includes marks disposed on the insulating thin film at regular intervals in the longitudinal direction of the thin film. Therefore, the length of the signal transmission tape is controlled.

DETAILED DESCRIPTION OF THE PREFERRED EMBODIMENTS

Figure 1A:
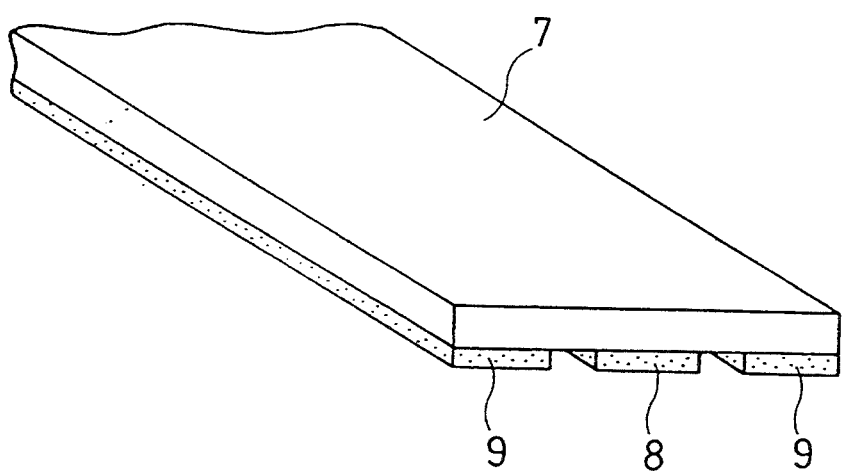
FIGS. 1(a) and 1(b) are a perspective view and a plan view illustrating a high frequency signal transmission tape in accordance with a first embodiment of the present invention.
Figure 1B:
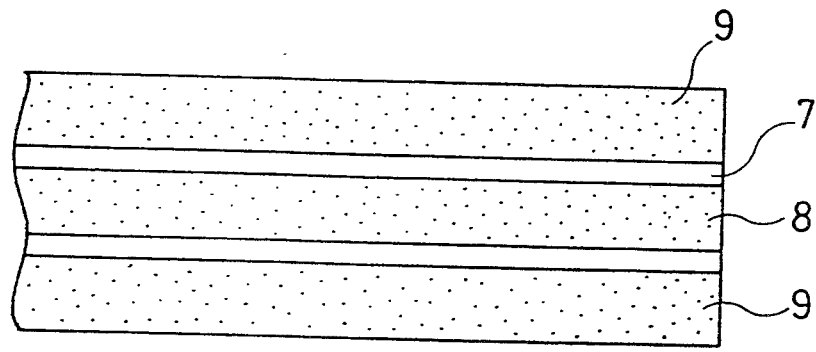

FIGS. 1(a) and 1(b) are a perspective view and a bottom view illustrating a high frequency signal transmission tape in accordance with a first embodiment of the present invention. In these figures, reference numeral 7 designates an insulating thin film having a thickness of 30 microns and a width of 340 microns and comprising a hard dielectric material, such as Teflon or a ceramic. A signal line 8 and grounding lines 9 are disposed on a surface of the insulating thin film. The grounding lines 9 are disposed at opposite sides of and parallel to the signal line 8 with prescribed spacing from the signal line. In production, a low resistance and soft metal, such as Au, Cu, or Al, is plated on the surface of the insulating thin film 7 to a thickness of about 20 microns. Then, the plated metal film is formed in a desired pattern using conventional photolithography, resulting in the signal line 8 and the grounding lines 9. The width of each line is about 100 microns and the space between adjacent lines is about 20 microns.

Figure 2:
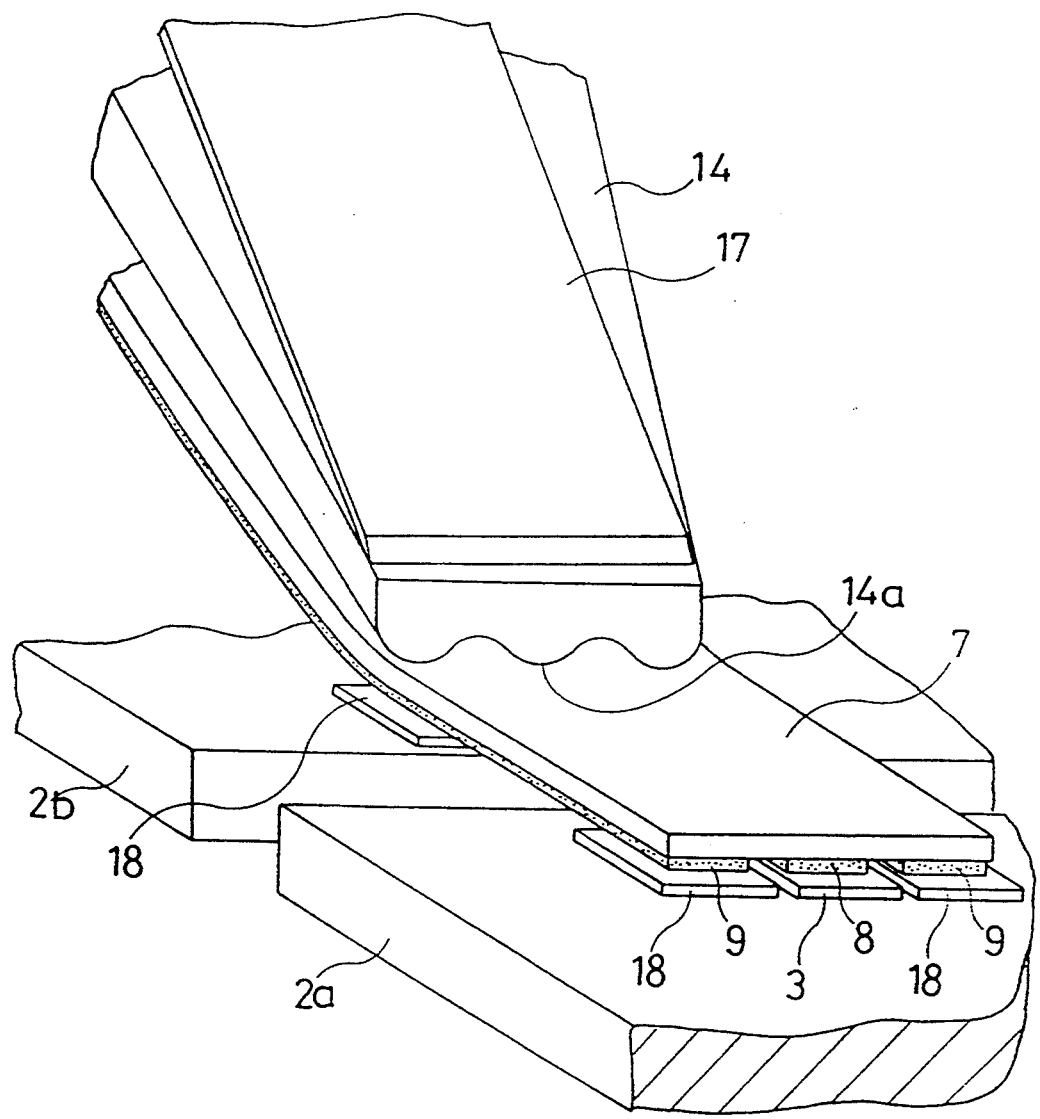
FIG. 2 is a perspective view illustrating the high frequency signal transmission tape of FIGS. 1(a) and 1(b) during the bonding process.
Figure 3:
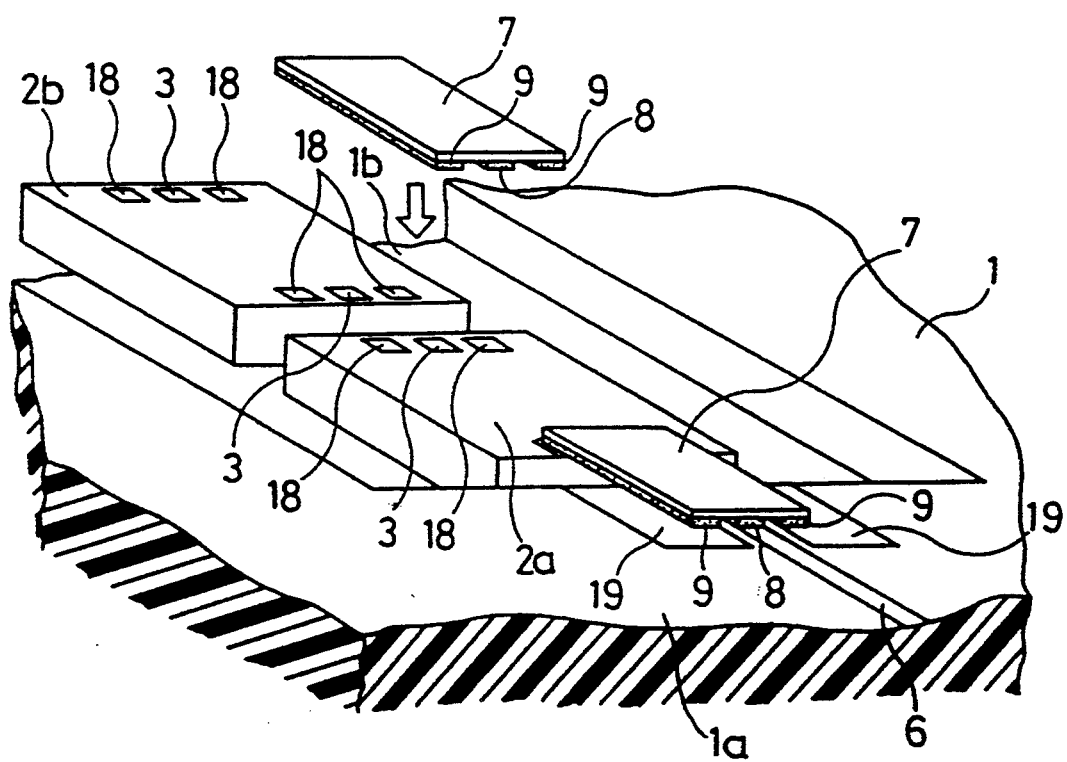
FIG. 3 is a perspective view illustrating the high frequency signal transmission tape of FIGS. 1(a) and 1(b) after the bonding process.

A description is given of the bonding process. First of all, as shown in FIG. 2, the signal line 8 of the high frequency signal transmission tape is applied to an input-output pad 3 of a high frequency IC chip 2a mounted on a package (not shown) while the grounding lines 9 are applied to grounding pads 18 of the IC chip 2a. In this state, a wedge type blade 14 is applied to a portion of the insulating thin film 7 opposite the pads 3 and 18 of the IC chip 2a, and heat or ultrasonic waves are applied through the thin film 7 to adhere the lines 8 and 9 to the pads 3 and 18, respectively. When the lines 8 and 9 comprise Au, heat and ultrasonic waves are applied and, when the lines comprise Al, only ultrasonic waves are applied. Since convex parts 14a corresponding to the signal line 8 and grounding lines 9 are formed at the tip of the blade 14, these lines are adhered to the pads with high reliability. In addition, the blade 14 is provided with a cutter 17. After the bonding, the cutter 17 slides downward along the blade 14 and cuts the signal transmission tape. In this way, as illustrated in FIG. 3, the high frequency IC chip 2a is electrically connected to the adjacent IC chip 2b and to the package 1 via the high frequency signal transmission tape. When the IC chip 2a is connected to the package, the signal line 8 and the grounding lines 9 of the signal transmission tape are in contact with the signal transmission line 6 and the external grounding pads 9 of the package 1, respectively.

Figure 4:
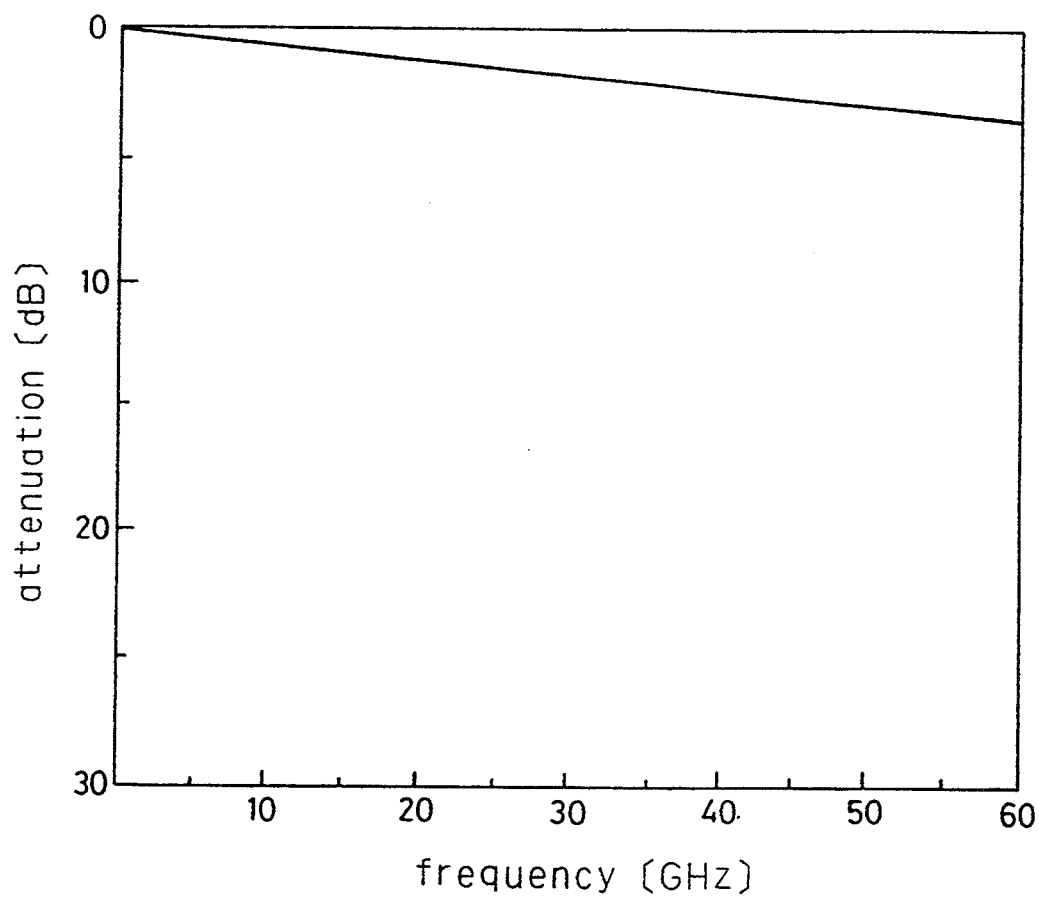
FIG. 4 is a graph illustrating attenuation vs. frequency characteristics of the high frequency signal transmission tape of FIGS. 1(a) and 1(b)

According to the first embodiment of the present invention, the high frequency signal transmission tape comprises the insulating thin film 7, the signal line 8 disposed on the surface of the thin film 7, and the grounding lines 9 disposed on opposite sides of and parallel to the signal line 8 with prescribed spacing from the signal line 8. That signal transmission tape offers improved impedance matching and has a small inductance. Therefore, when the tape is used for connecting the IC chips 2a and 2b to each other or connecting the IC chip 2a to the signal transmission line 6 of the package 1, the connection is carried out with low loss and low reflection in the extremely high frequency band, i.e., the millimeter-wave frequency band over 30 GHz, as shown in FIG. 4.

Further, even if the high frequency IC chips are arbitrarily arranged on the chip bonding part 1b of the package 1, these IC chips are easily connected to each other using the signal transmission tape without increasing the production cost.

Figure 5:
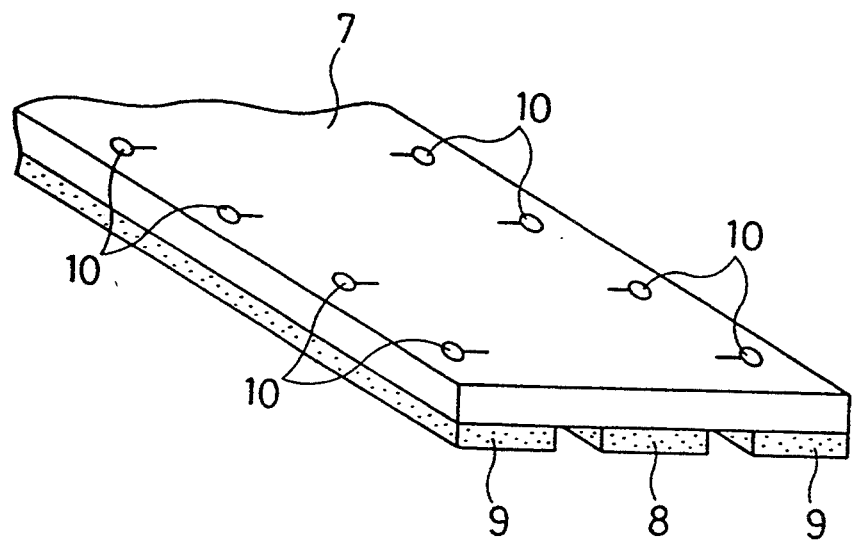
FIG. 5 is a perspective view illustrating a high frequency signal transmission tape in accordance with a second embodiment of the present invention.

FIG. 5 is a perspective view illustrating a high frequency signal transmission tape in accordance with a second embodiment of the present invention. The fundamental structure of the signal transmission tape of this second embodiment is identical to that of the first embodiment. In this second embodiment, marks 10 are printed on a surface of the insulating thin film 7, where the conductive lines 8 and 9 are absent, at regular intervals in the longitudinal direction of the thin film 7. When the bonding is carried out while referring to the marks 10, the length of the signal transmission tape is controlled, improving repeatability and uniformity of electrical characteristics, such as impedance.

Figure 6A:
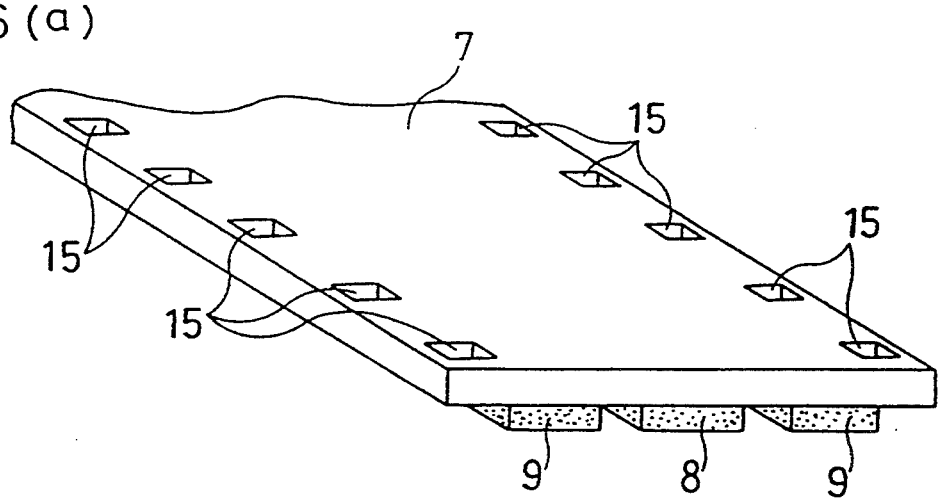
FIG. 6(a) is a perspective view illustrating a high frequency signal transmission tape in accordance with a third embodiment of the present invention and FIG. 6(b) is a perspective view illustrating the high frequency signal transmission tape during the bonding process.
Figure 6B:
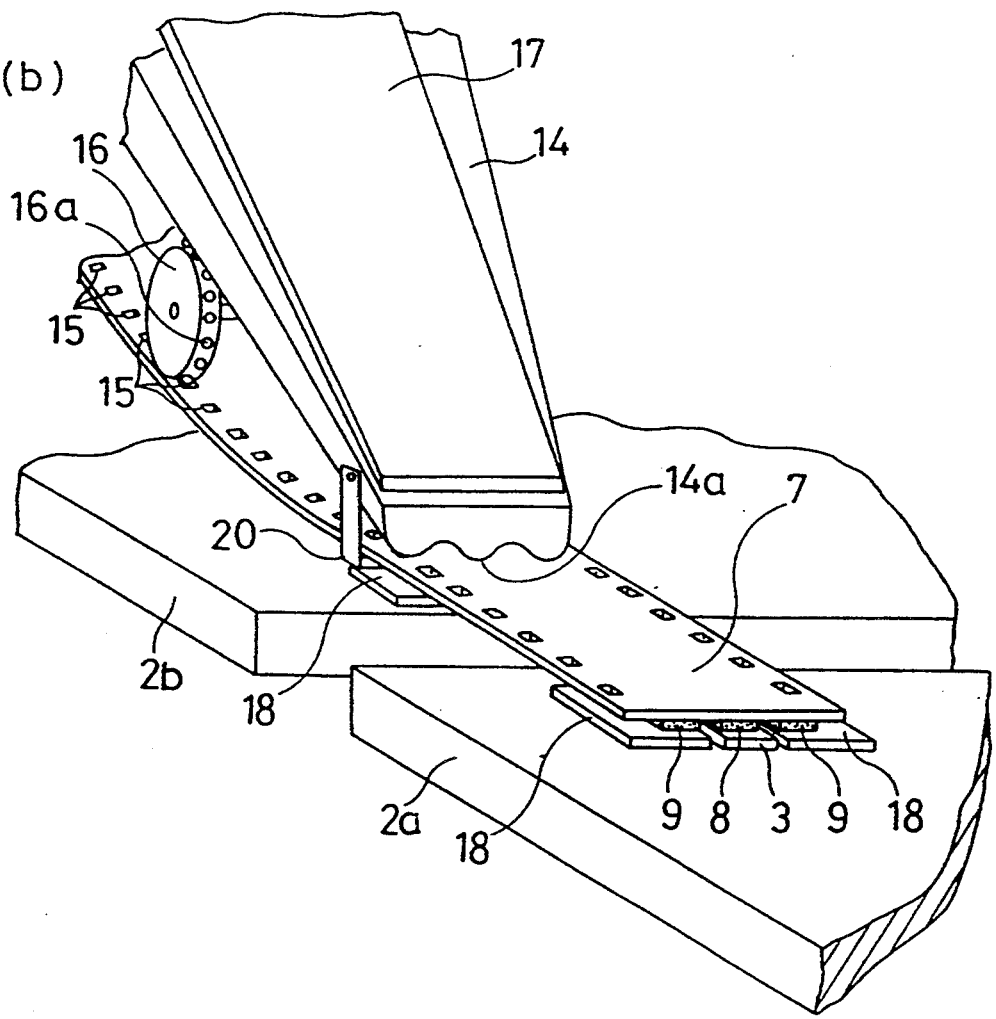

FIG. 6(a) is a perspective view illustrating a high frequency signal transmission tape in accordance with a third embodiment of the present invention. In FIG. 6(a), small openings 15, about 0.1 micron along each edge, are formed through the insulating thin film 7 at regular intervals in the longitudinal direction of the tape, and the bonding is carried out using the openings 15 as the marks for controlling the length of the tape. FIG. 6(b) illustrates the bonding process. The wedge type blade 14 is provided with a tape guide 20 through which the high frequency signal transmission tape is applied to the surface of the IC chip, and a sprocket roller 16 having projections 16a arranged at the same intervals as the intervals of the openings 15. After bonding the signal line 8 and the grounding lines 9 onto the input-output pad 3 and the grounding pads 18 of the IC chip 2a, respectively, the tip of the blade 14 is moved backward and applied to the bonding pads of the IC chip 2b. While moving the blade 14, the projections 16a of the sprocket roller 16 detect the openings 15 to measure the length of the signal transmission tape. Since the length of the signal transmission tape is mechanically controlled in this way, repeatability and uniformity of electrical characteristics are further improved.

While in the above-described third embodiment the openings 15 are mechanically detected by the sprocket roller, the openings may be detected using an electrical or optical method.

Figure 7A:
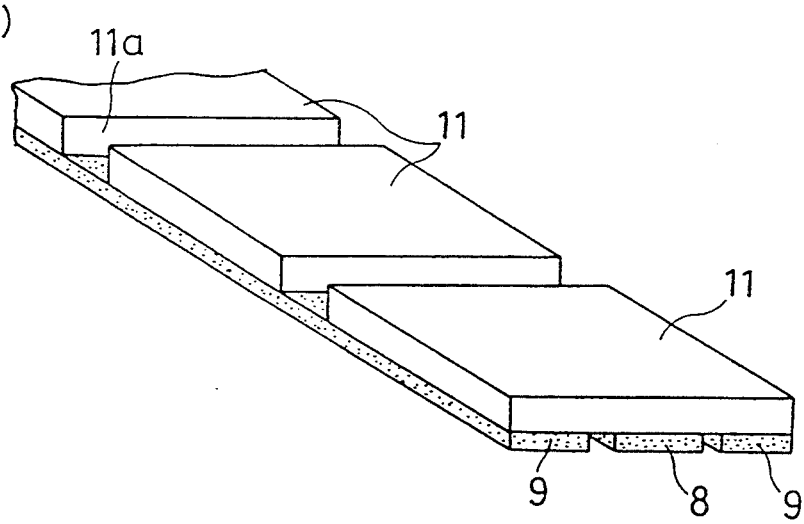
FIGS. 7(a), 7(b), and 7(c) are a perspective view and plan views illustrating a high frequency signal transmission tape in accordance with a fourth embodiment of the present invention.
Figure 7B:
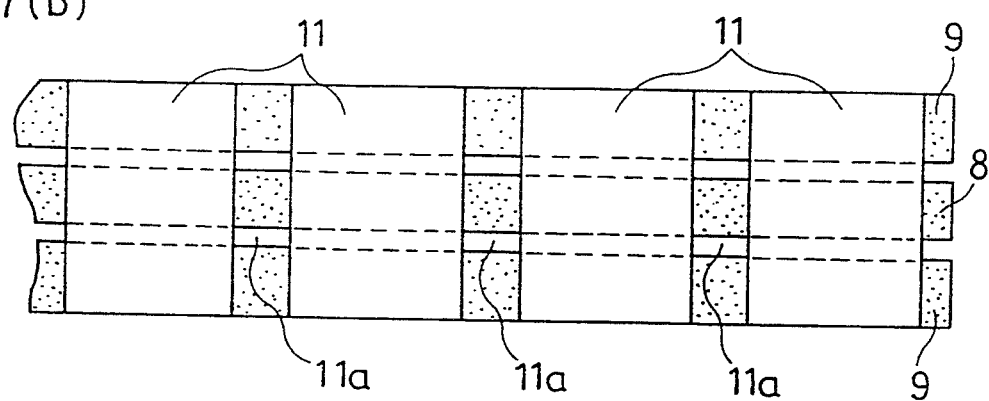
Figure 7C:
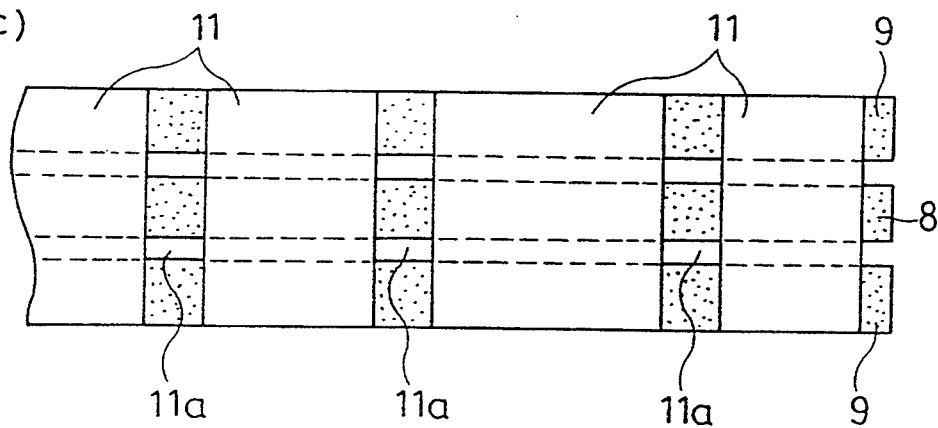
Figure 8:
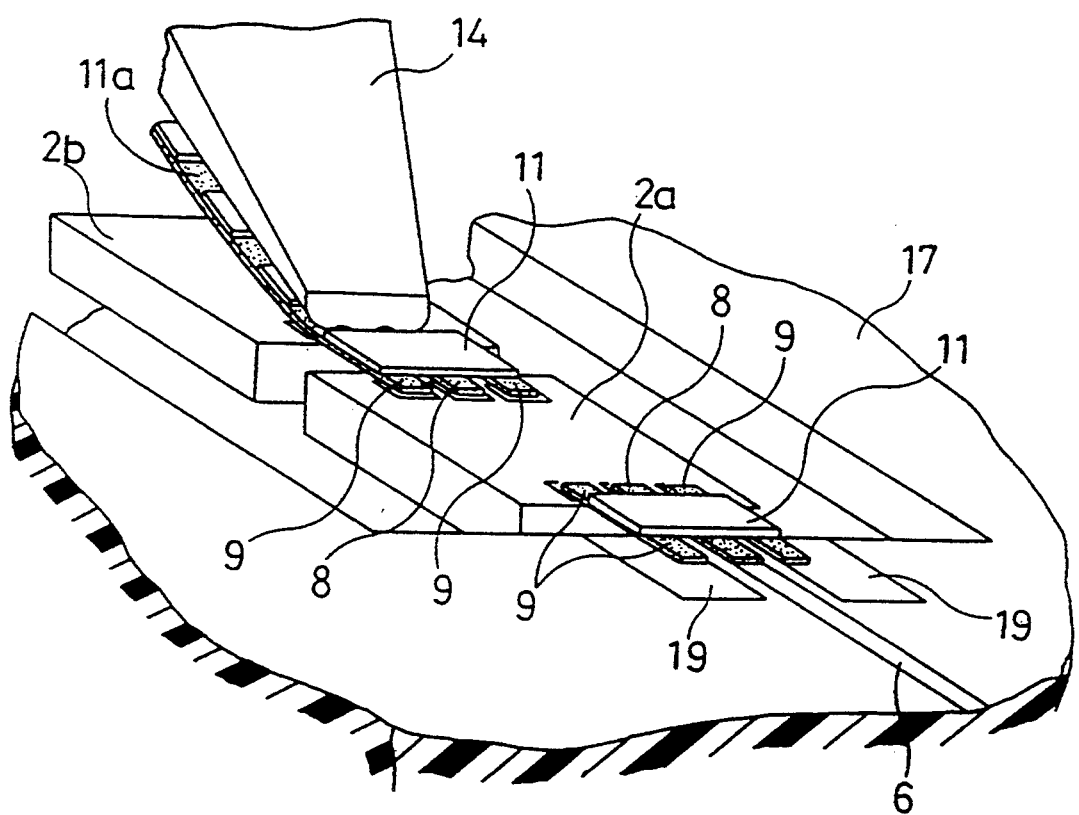
FIG. 8 is a perspective view illustrating the high frequency signal transmission tape of FIGS. 7(a), 7(b), and 7(c) during the bonding process.

FIGS. 7(a) to 7(c) are a perspective view and plan views illustrating a high frequency signal transmission tape in accordance with a fourth embodiment of the present invention. In this fourth embodiment, soft dielectric material, for example, polyimide, is employed for the insulating thin film 11. Since such soft dielectric material easily absorbs ultrasonics waves, slits 11a are formed in the width direction of the thin film 11 to expose the signal line 8 and the grounding lines 9. The width of each slit is about 100 microns. When bonding this high frequency signal transmission tape onto an IC chip, as illustrated in FIG. 8, the tip of the blade 14 is directly applied to the signal line 8 and the grounding lines 9 exposed in the slit 11a so that ultrasonic waves or heat is directly applied to these lines. In this case, the length of the signal transmission tape is controlled by the slits 11a.

In FIG. 7(c), the slits 11a are formed according to the intervals between a plurality of arbitrarily arranged IC chips, whereby work efficiency in mass production is improved.

Figure 9A:
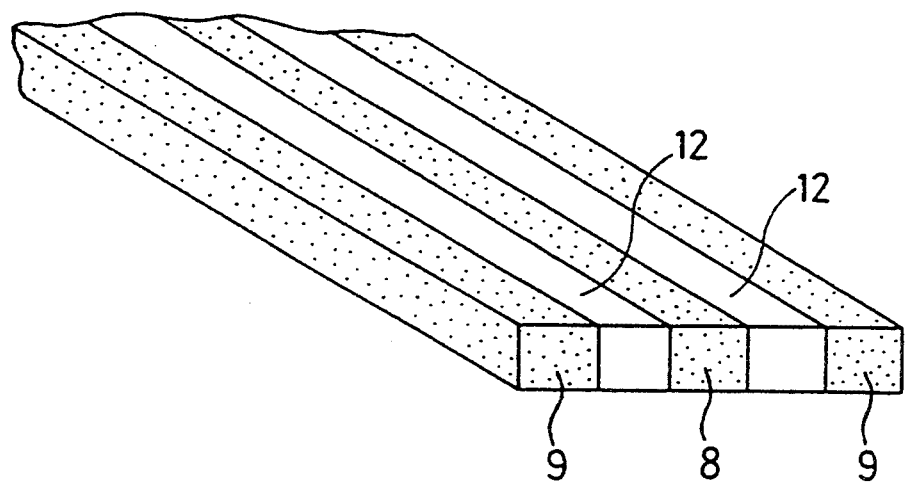
FIGS. 9(a) and 9(b) are perspective views illustrating a high frequency signal transmission tape in accordance with a fifth embodiment of the present invention.
Figure 9B:
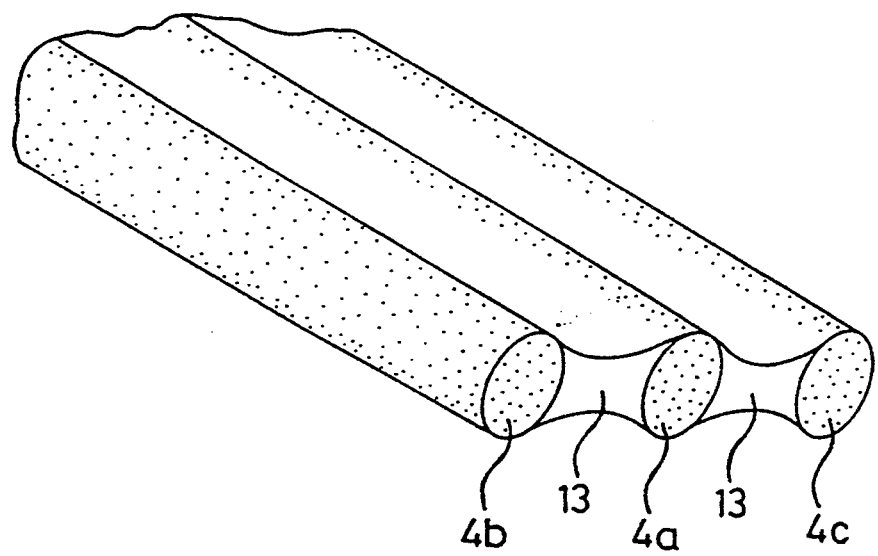
Figure 10:
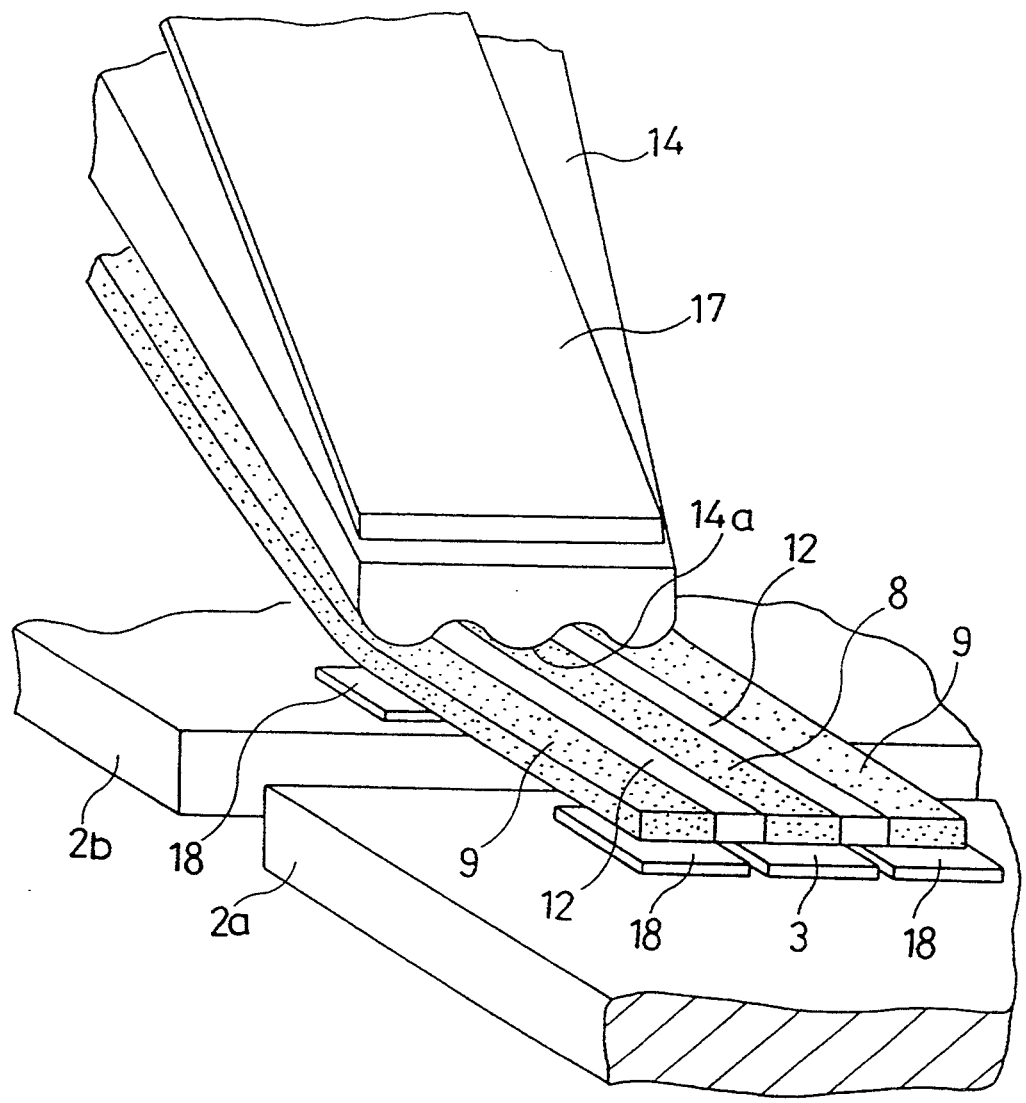
FIG. 10 is a perspective view illustrating the high frequency signal transmission tape of FIGS. 9(a) and 9(b) during the bonding process.
Figure 11:
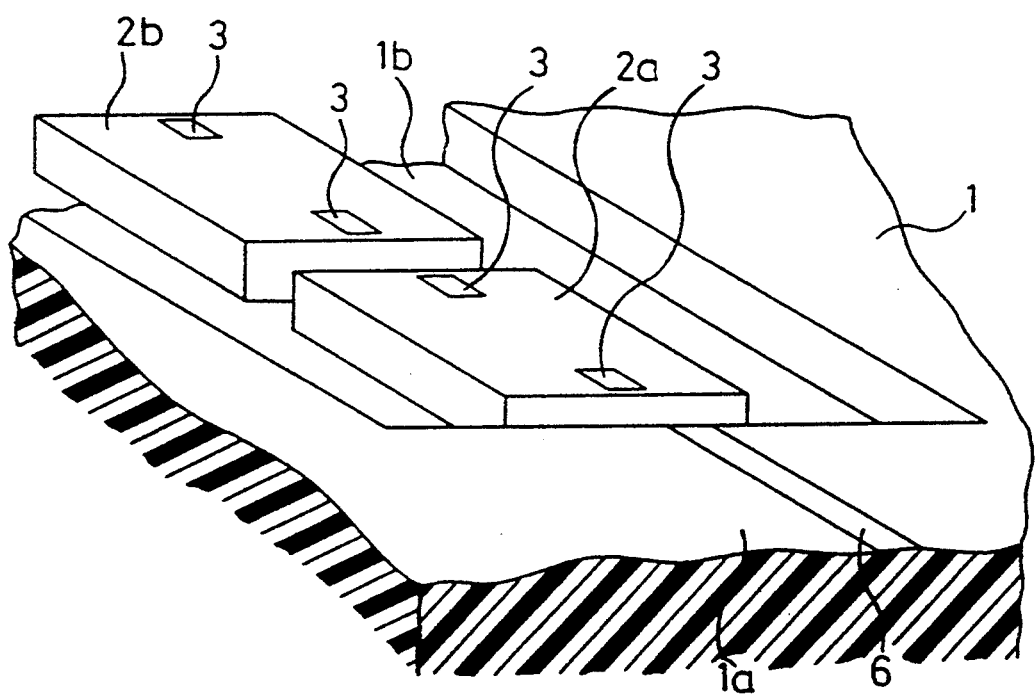
FIG. 11 is a perspective view illustrating a package on which high frequency IC chips are mounted.
Figure 12:
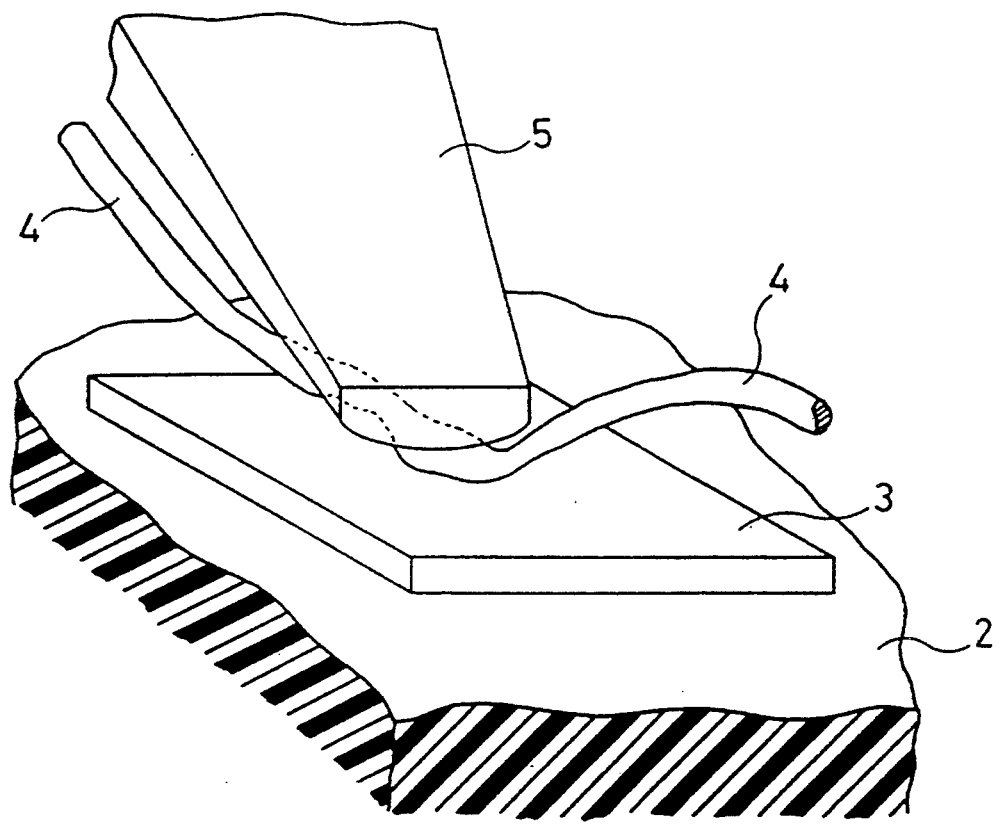
FIG. 12 is a perspective view illustrating a metal wire during the bonding process in accordance with the prior art.
Figure 13:
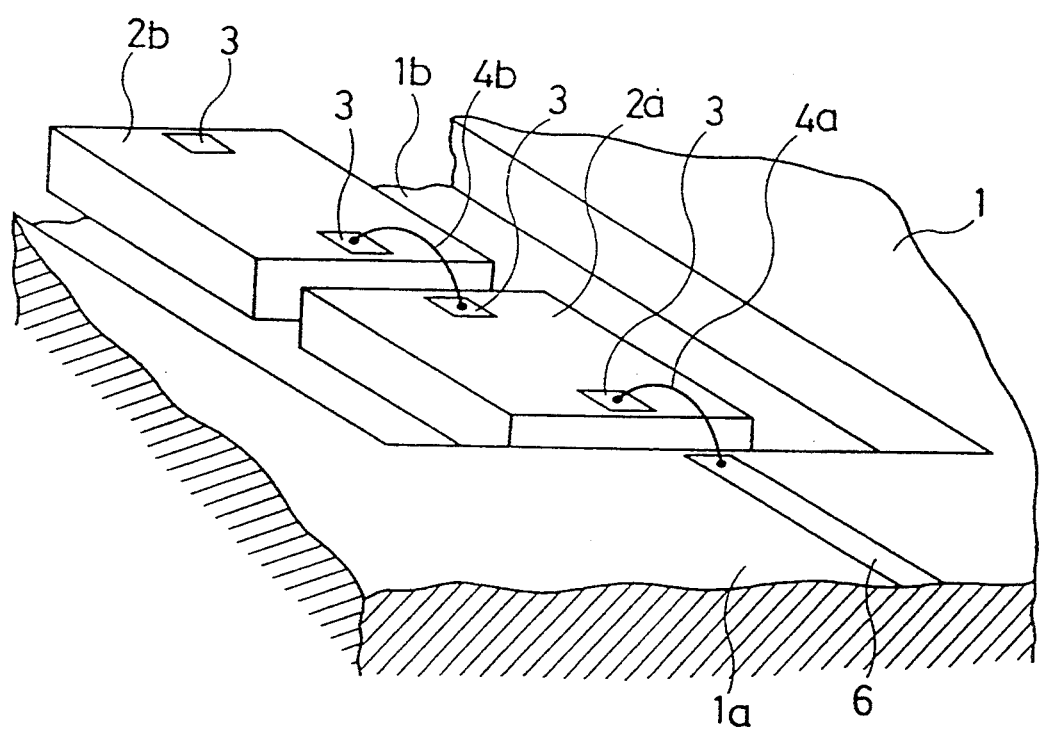
FIG. 13 is a perspective view illustrating the package of FIG. 11 after the bonding process.
Figure 14:
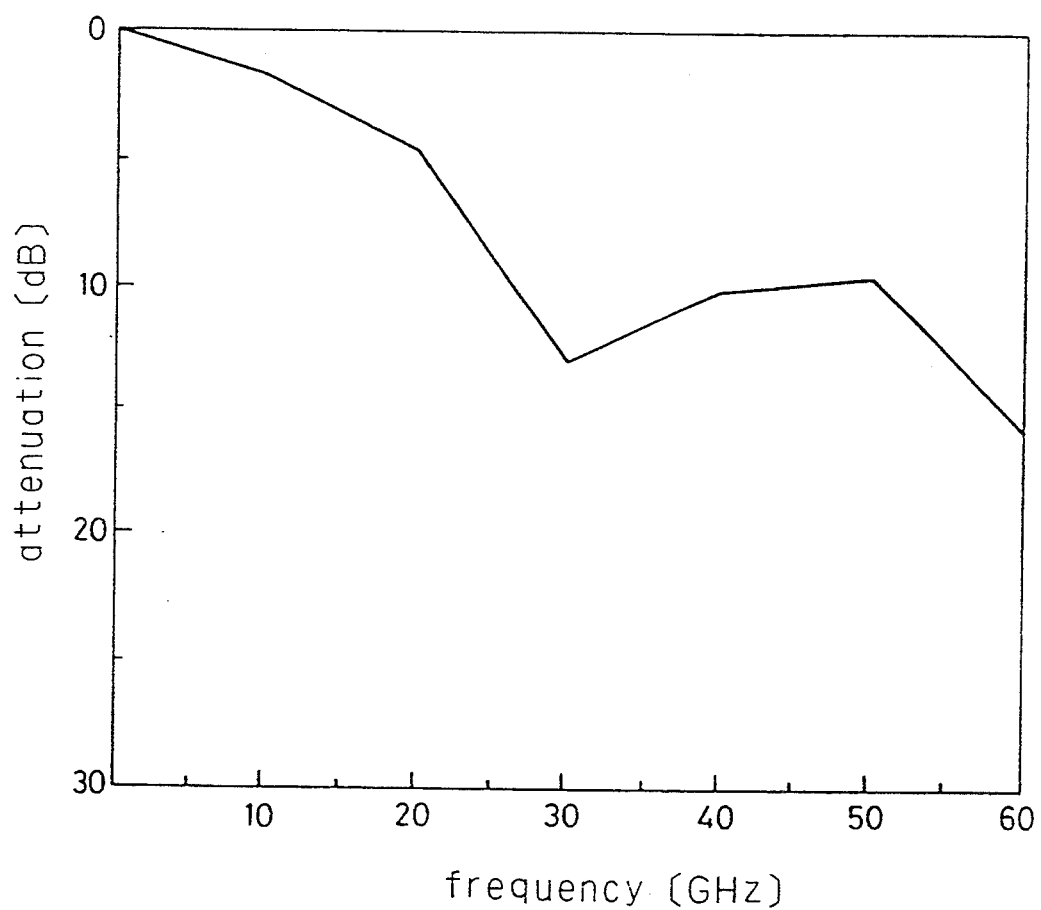
FIG. 14 is a graph illustrating attenuation vs. frequency characteristics of the metal wire of FIG. 12.
Figure 15A:
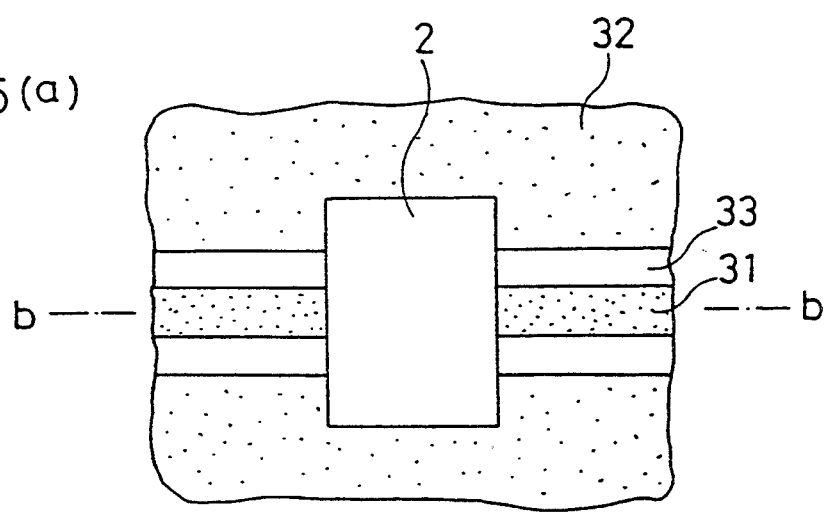
FIGS. 15(a) and 15(b) are a plan view and a cross-sectional view illustrating a high frequency IC chip mounted on a coplanar transmission line on a package in accordance with the prior art.
Figure 15B:
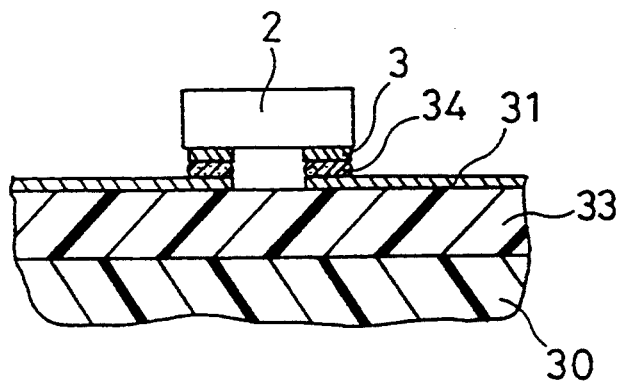
Figure 16:
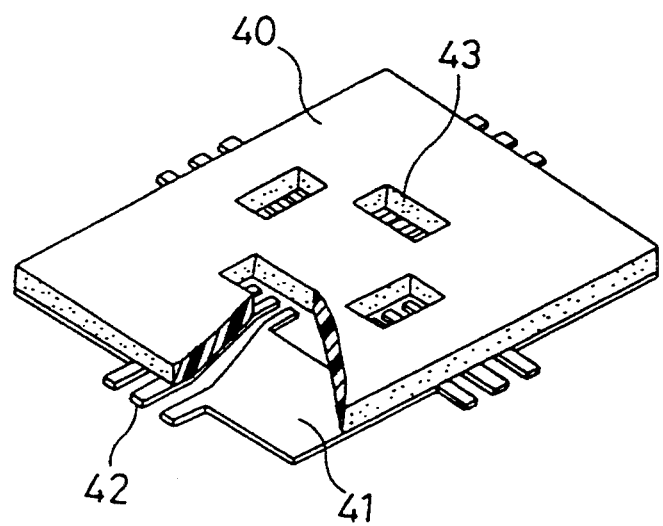
FIG. 16 is a perspective view, partly broken away, illustrating an impedance-matched film carrier having a coplanar transmission line in accordance with the prior art.

FIGS. 9(a) and 9(b) are perspective views illustrating a high frequency signal transmission tape in accordance with a fifth embodiment of the present invention. In this fifth embodiment, a high frequency signal transmission tape comprises a signal conductor 8, dielectric layers 12 disposed on opposite sides of the signal conductor 8, and grounding conductors 9 disposed on opposite sides of the dielectric layers 12. Preferably, the dielectric layer 12 comprises ceramic and the conductors 8 and 9 comprise Au. FIG. 10 illustrates the high frequency signal transmission tape of FIG. 9(a) during the bonding process.

As shown in FIG. 9(b), three metal wires, such as Au wires, 4a to 4c may be connected via a dielectric resin 13 to form a high frequency signal transmission tape. In this case, the metal wire 4a serves as a signal line and the metal wires 4b and 4c serve as grounding lines.

What is claimed is:

1. A high frequency signal transmission tape for making an electrical connection to a high frequency IC chip comprising:
   an insulating film having opposite first and second surfaces;
   a conductive signal line disposed on said first surface; and
   two conductive grounding lines disposed on said first surface on opposite sides of, parallel to, and spaced apart from said signal line wherein said insulating film includes a plurality of slits transverse to said signal line, said signal line and said grounding lines being exposed in and by the slits.

2. The high frequency signal transmission tape of claim 1 wherein adjacent slits are spaced apart at a substantially uniform interval.

3. A high frequency signal transmission tape for making an electrical connection to a high frequency IC chip comprising:
   an insulating film having opposite first and second surfaces.;
   a conductive signal line disposed on said first surface; and
   two conductive grounding lines disposed on said first surface on opposite sides of, parallel to, and spaced apart from said signal line wherein marks are disposed on said second surface of said insulating film at regular intervals in a longitudinal direction of said insulating film generally parallel to said signal line and said grounding lines.

4. A high frequency signal transmission tape for making an electrical connection to a high frequency IC chip comprising:
   an insulating film having opposite first and second surfaces;
   a conductive signal line disposed on said first surface; and
   two conductive grounding lines disposed on said first surface on opposite sides of, parallel to, and spaced apart from said signal line wherein openings penetrating through said insulating film are disposed at regular intervals in a longitudinal direction of said insulating film generally parallel to said signal line and said grounding lines.

5. A high frequency signal transmission tape for making an electrical connection to a high frequency IC chip comprising:
   a conductive signal line and two conductive grounding lines, said signal line and said grounding lines each having a rectangular cross-section with opposed first and second principal surfaces and first and second side wall surfaces transverse to the principal surfaces, said first principal surfaces of said signal line and said grounding lines lying in a plane with said signal line spaced from and disposed between said grounding lines; and a dielectric material disposed between and contacting said side wall surfaces of said signal line and said grounding lines, adhering said signal line to said grounding lines with said first and second principal surfaces exposed for bonding said signal line and said grounding lines to a high frequency IC chip.

6. A high frequency transmission tape for making an electrical connection to a high frequency IC chip comprising:

a conductive signal line and two conductive grounding lines, said signal line and said grounding lines each having circular cross-sections with centers and outside surfaces, the centers of said signal line and said grounding lines lying in a plane with said signal line spaced from and disposed between said grounding lines; and a dielectric material disposed between and contacting parts of said outside surfaces of said signal line and said grounding lines, adhering said signal line to said grounding lines, said signal line and said grounding lines being commonly exposed along parts of the outside surfaces of said signal line and said grounding lines along a longitudinal direction of said tape generally parallel to said signal line and said grounding lines for bonding said signal line and said grounding lines to a high frequency IC chip.

* * * * *